(12) United States Patent
Mecking et al.

(10) Patent No.: US 7,027,237 B2
(45) Date of Patent: Apr. 11, 2006

(54) METHOD FOR IMPROVING THE IMAGING PROPERTIES OF AT LEAST TWO OPTICAL ELEMENTS AND PHOTOLITHOGRAPHIC FABRICATION METHOD

(75) Inventors: Birgit Mecking, Aalen (DE); Toralf Gruner, Königsbronn (DE); Alexander Kohl, Aalen (DE)

(73) Assignee: Carl Zeiss SMT AG, (DE)

( * ) Notice: Subject to any disclaimer, the term of this patent is extended or adjusted under 35 U.S.C. 154(b) by 0 days.

(21) Appl. No.: 11/185,066

(22) Filed: Jul. 20, 2005

(65) Prior Publication Data

US 2005/0254773 A1   Nov. 17, 2005

Related U.S. Application Data

(63) Continuation of application No. 10/709,098, filed on Apr. 13, 2004, now Pat. No. 6,963,449, which is a continuation of application No. PCT/EP02/11030, filed on Oct. 2, 2002.

(30) Foreign Application Priority Data

Dec. 20, 2001   (DE) ............................. 101 62 796

(51) Int. Cl.
*G02B 7/02*   (2006.01)

(52) U.S. Cl. ...................... 359/822; 359/823; 359/811

(58) Field of Classification Search ................ 359/822, 359/823, 824, 811, 813, 814; 355/53, 67, 355/68
See application file for complete search history.

(56) References Cited

U.S. PATENT DOCUMENTS

| 2003/0128349 A1 | 7/2003 | Unno | 355/67 |
| 2003/0168597 A1 | 9/2003 | Webb et al. | 250/330 |

FOREIGN PATENT DOCUMENTS

EP   1 063 684 A1   12/2000

OTHER PUBLICATIONS

U.S. Appl. No. 10/709,098, Apr. 13, 2004, Kurz et al.

*Primary Examiner*—Timothy Thompson
(74) *Attorney, Agent, or Firm*—Factor & Lake

(57) ABSTRACT

A method for improving imaging properties of two or more optical elements comprises the step of determining for at least one of the two optical elements a polarization-dependent perturbation. In a further step a polarization-independent perturbation is determined for at least one of the two optical elements. Then a target position for the at least one movable optical element is calculated such that, in the target position, the total perturbation of the at least two optical elements which is made up of the polarization-dependent perturbations and polarization-independent perturbations of the two optical elements, is minimized. Finally the at least one movable optical element is moved the to the calculated target position.

10 Claims, 5 Drawing Sheets

METHOD FOR IMPROVING THE IMAGING PROPERTIES OF AT LEAST TWO OPTICAL ELEMENTS AND PHOTOLITHOGRAPHIC FABRICATION METHOD

CROSS-REFERENCE TO RELATED APPLICATIONS

This application is a continuation application of U.S. patent application Ser. No. 10/709,098 filed on Apr. 13, 2004, now U.S. Pat. No. 6,963,449 which is a continuation of and claims priority to International Application PCT/EP02/11030, with an international filing date of Oct. 2, 2002, which claims priority to German patent application number 101 62 796.3, filed on Dec. 20, 2001, upon which the present application also claims priority, all of which are incorporated herein by reference.

FIELD OF THE INVENTION

The invention relates to a method for improving the imaging properties of at least two optical elements. More particularly, the invention relates to such a method in which the relative position of the optical elements is mutually adjusted in order to improve the optical imaging. The invention further relates to a photolithographic fabrication method.

DESCRIPTION OF RELATED ART

From EP 1 063 684 A1 it is known to determine the birefringence distribution of individual lenses inside a projection lens of a projection exposure system as a polarisation-dependent perturbation. The lenses are then selected and arranged inside the projection lens so as to obtain a total birefringence whose magnitude is less than a predetermined limit value for each optical path through the projection lens. The total birefringence is in this case made up of the sum of all the birefringences of the individual lenses being analysed. Such a method is helpful when lenses need to be rejected on the basis of an intolerable birefringence distribution, but in practice does not always lead to specification values being achieved for the imaging properties of the optical elements.

Another optimisation method is known from the specialist article "The development of microlithographic high-performance optics", Int. J. of Optoelec., 1989, 545. When optimising the imaging properties of optical systems having optical elements which are made of crystalline materials, this method provides satisfactory results only if the crystalline materials are specially selected and the optical elements are mounted without stress. Such measures are expensive.

SUMMARY OF THE INVENTION

It is therefore a first object of the present invention to refine an optimisation method of the type mentioned in the introduction, so that a total imaging error made up of the imaging errors of the individual optical components can be further reduced for most practical applications.

This object is achieved according to the invention by a method having the features mentioned in claim 1.

The method according to the invention is based on the following facts:

As a rule, polarisation-dependent and polarisation-independent perturbations contribute to the total perturbation. Polarisation-dependent perturbations can be subdivided into: intrinsically present polarisation-dependent perturbations, such as the intrinsic birefringence, i.e. that which occurs even in a homogeneous and stress-free material; polarisation-dependent perturbations occurring because of external effects, such as stress birefringence; and polarisation-dependent perturbations occurring because of material inhomogeneities, such as birefringence due to crystal defects, especially due to the formation of domains in the material.

As a rule, previous determination methods for determining the imaging errors of optical elements have been restricted to polarisation-independent perturbations, since it was assumed that conventional optical materials have polarisation-dependent perturbations only in exceptional cases. These polarisation-dependent perturbations have previously been accommodated without including them in a target-position calculation. This was done, as mentioned above, by material selection or special mounting.

It is known from the Internet publication "Preliminary determination of an intrinsic birefringence in CaF2" by J. H. Burnett, G. L. Shirley and Z. H. Levine, NIST Gaithersburg Md. 20899 USA (posted on Jul. 5, 2001), however, that single CaF2 crystals also have non-stress-induced, i.e. intrinsic birefringence. This applies, for example, to ray propagation in the (110) crystal direction. For ray propagation in the (100) crystal direction and in the (111) crystal direction, however, CaF2 does not have any intrinsic birefringence. The birefringence that occurs is therefore dependent on the ray direction. It cannot be eliminated either by material selection or by stress-free mounting of an optical element.

Since CaF2 and other crystalline materials with intrinsic birefringence are being used increasingly as optical materials, particularly in conjunction with UV light sources, the neglect of polarisation-dependent perturbations is leading to imaging errors which are not picked up in the known optimisation methods.

Polarisation-dependent perturbations cause light rays with orthogonal polarisations to be imaged at different positions. Polarisation effects can furthermore cause individual polarisation components to experience different imaging errors.

Although the aforementioned EP 1 063 684 A1 takes into account a polarisation-dependent perturbation, namely the birefringence, it ignores other perturbations in the scope of optimising the mutual arrangement of the optical components, so that there may some be error contributions to the total imaging error which are avoidable.

According to the invention, both the polarisation-dependent perturbations and the polarisation-independent perturbations are taken into account in the target-position calculation. In this way, the optical elements can be modelled precisely and fully in respect of their imaging properties.

The polarisation-dependent perturbation according to claim 2 takes into account the effect of internal stresses in the optical materials. These internal stresses may, for instance, have been frozen in the material during the production process, or may occur because of the mechanical mounting (frame) of the optical element. Taking the stress birefringence into account improves the optimisation of the imaging properties even for optical elements which do not have any intrinsic stress birefringence.

Determining the position of at least one crystal axis according to claim 3 can obviate further measurement of polarisation-dependent perturbations in the most favourable case, if there are no other polarisation-dependent perturbations, since the intrinsic birefringence can be calculated following determination of the crystal axis position.

A degree of freedom in movement which is relatively straightforward to achieve, since it does not involve significant intervention in the mounting of the optical element, is the rotatability of the at least one optical element according to claim 4.

The effects of displacing a linearly displaceable optical element according to claim 5 on the imaging properties of the at least two optical elements allow precise predictions, for example by means of optical design programs, which facilitates calculation of the target position.

Centring errors, in particular, can be compensated for by a displaceable optical element according to claim 6.

A tiltable optical element according to claim 7, for example, allows alignment of the crystal axes of the optical element relative to the optical axis of an overall optical system, which includes the at least two optical elements.

The effect of determining the polarisation-dependent perturbation according to claim 8 is that the contributions to the stress birefringence from the frame are also taken into account in the determination of the polarisation-dependent perturbation. This increases the precision of the optimisation method.

It is also an object of the present invention to provide a photolithographic fabrication method with improved optical quality.

This object is achieved according to the invention by a method having the features mentioned in claim 9. The advantages of the fabrication method derive from the aforementioned advantages of the optimisation method.

At an exposure wavelength according to claim 10, many optical materials have polarisation-dependent perturbations which affect the imaging properties of optical elements more strongly than, for example, when they are exposed to visible light. The optimisation method according to the invention is therefore very effective with exposure to wavelengths of less than 200 nm.

BRIEF DESCRIPTION OF THE DRAWINGS

An exemplary embodiment of the invention will be explained in more detail below with reference to the drawing, in which.

DETAILED DESCRIPTION OF PREFERRED EMBODIMENTS

Figure 1:
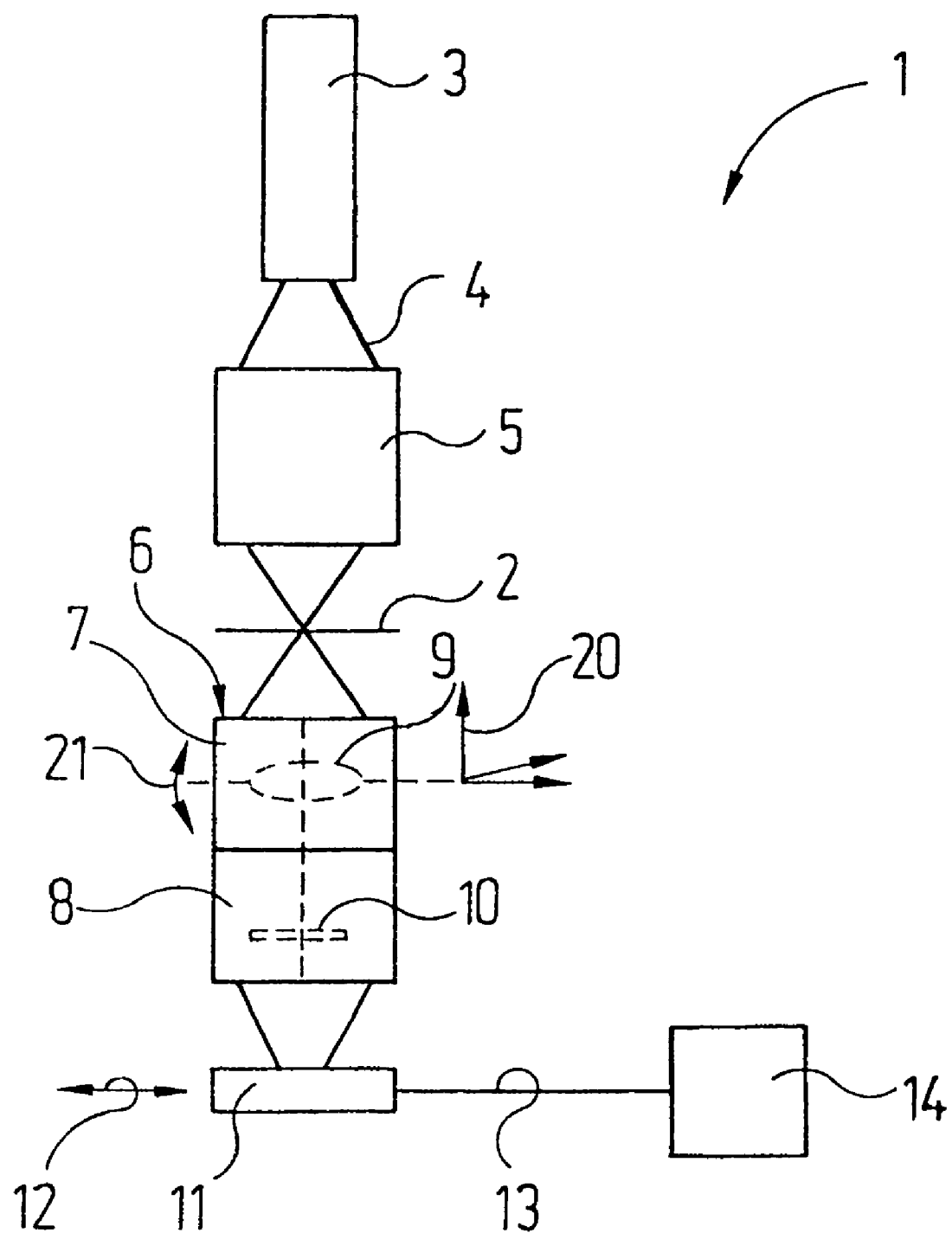
FIG. 1 shows a projection exposure system for microlithography.

A projection exposure system denoted overall by 1 in FIG. 1 is used for transferring a structure from a mask 2 to a wafer (not shown in FIG. 1).

A light source 3, for example an F2 laser with a wavelength of 157 nm, generates a projection light beam 4 for this purpose. It passes first through illumination optics 5 for shaping, and subsequently through the mask 2. A projection lens 6 images the structure present on the mask 2 onto the wafer.

In FIG. 1, the projection lens 6 is divided into a part 7, rotatable about the optical axis of the projection lens 6, and a stationary part 8. In practice, there are often a plurality of rotatable parts in the projection lens 6; restriction to only one rotatable part 7, however, will suffice for the purpose of this description.

In FIG. 1, a biconvex lens 9 is indicated to exemplify the optical components of the rotatable part 7 and a plane-parallel optical plate 10 is indicated to exemplify the optical components of the stationary part 8. Furthermore, as illustrated by a Cartesian coordinate system 20 in FIG. 1, the lens 9 is displaceable both along the optical axis and transversely to the optical axis of the projection lens 6, and it is also tiltable relative to the optical axis of the projection optics 6 as indicated by a double arrow 21 in FIG. 1. The double arrow 21 here denotes one of two possible and mutually perpendicular tilting movements relative to the optical axis. Other optical elements of the projection lens 6, which are not explicitly represented in FIG. 1, may also have the said degrees of freedom in movement.

A position-sensitive sensor 11 is provided in order to analyse perturbations which affect the imaging properties of the projection lens 6. It is displaceable transversely to the optical axis of the projection lens 6, between a measurement position represented in FIG. 1 and a projection exposure position (not shown) withdrawn from the optical path of the projection light beam 4 (cf. double arrow 12 in FIG. 1). The sensor 11 is connected to a computer 14 via a signal line 13.

The lens 9 and the optical plate 10 are made from single crystals of CaF2, which has a cubic crystal symmetry. For production, these optical elements 9, 10 are cut from crystal blocks and polished.

Figure 2:
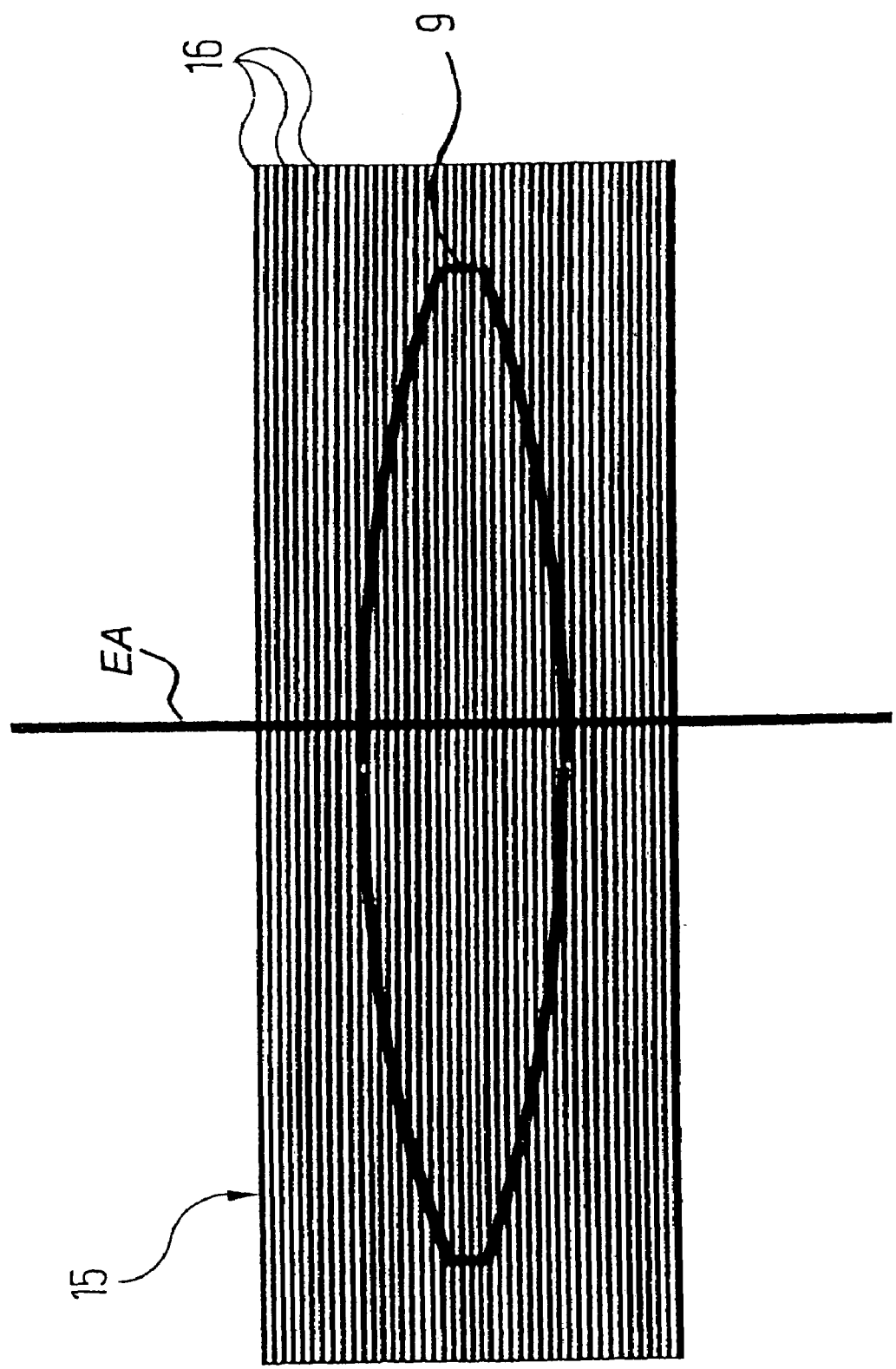
FIG. 2 shows a section through a block of a single crystal as the starting material for a lens of projection lens for the projection exposure system in FIG. 1.

Such a crystal block 15 for the lens 9 is represented by way of example in FIG. 2. It is oriented such that (100) crystal planes 16 are perpendicular to the plane of the drawing, so that their section lines constitute lines extending horizontally with the plane of the drawing. The lens 9 is machined from the crystal block 15 so that its element axis EA, i.e. the optical axis of the lens 9, coincides with the (100) crystal direction, which is perpendicular to the (100) crystal plane.

Figure 3:
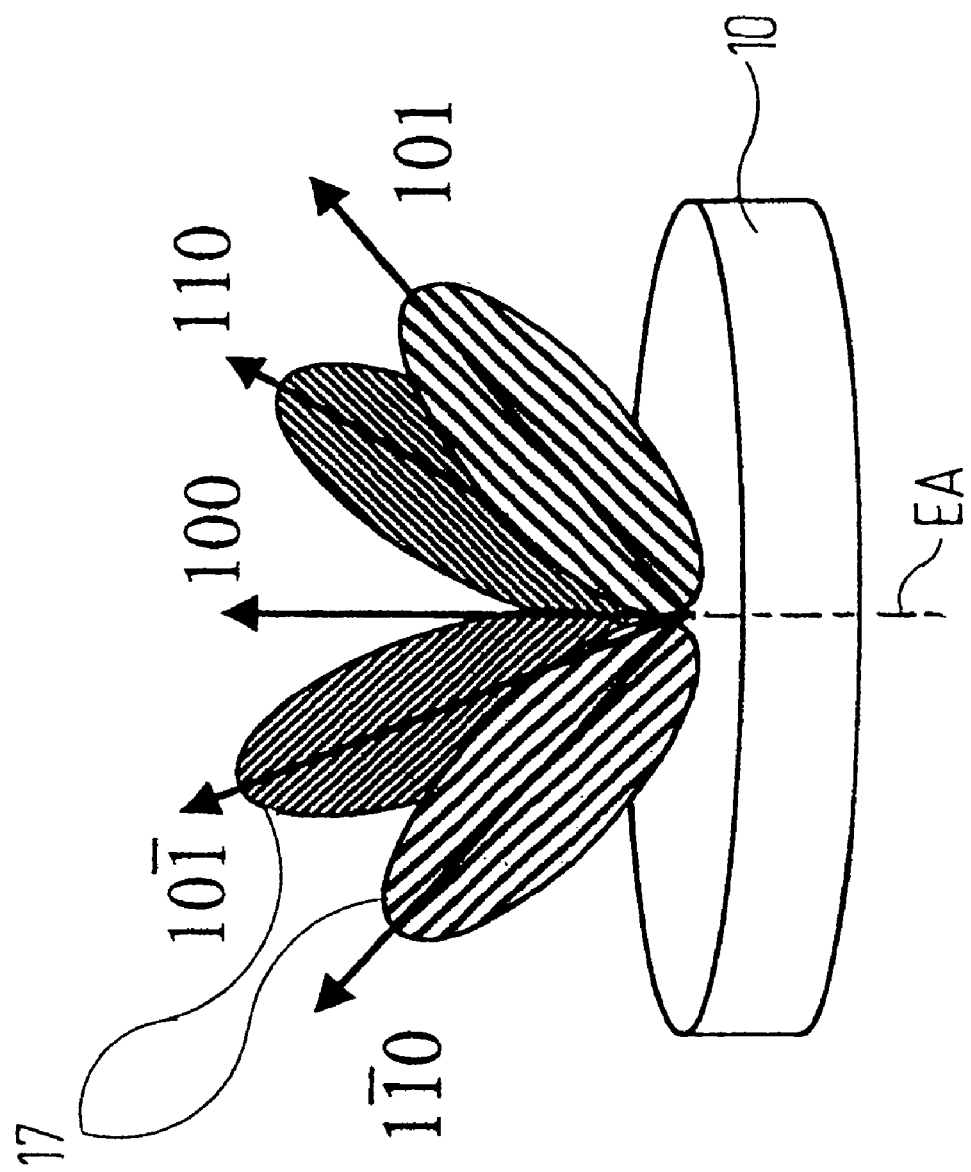
FIG. 3 shows a schematic representation of the intrinsic birefringence of an optical plate, made from a single crystal, of the projection lens for the projection exposure system in FIG. 1.

The optical plate 10, which is represented separately in FIG. 3, is also machined from a crystal block with such an orientation. Besides the (100) crystal direction, the (101), (110), (10-1) and (1-10) crystal directions are also represented there as arrows, the negative sign when indexing the crystal direction in this description being equivalent to the designation "upper crosswise" in the drawing. An intrinsic birefringence of the optical plate 10 is schematically represented by four "lobes" 17, the areas of which indicate the magnitude of the intrinsic birefringence for the respective ray direction of a light ray of the projection light beam 4 (cf. FIG. 1). The maximum intrinsic birefringence of the optical plate 4 is respectively obtained in the (101), (110), (10-1) and (1-10) crystal directions.

Figure 4:
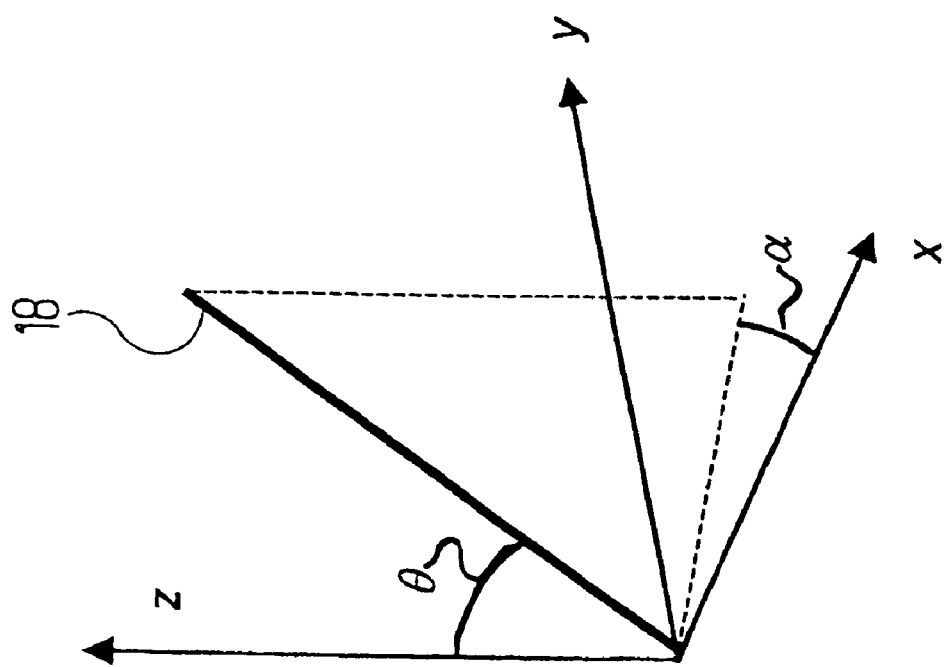
FIG. 4 shows a coordinate system defining an aperture angle and an azimuth angle for rays of a projection light beam of the projection exposure system in FIG. 1.

The ray direction of a light ray 18 of the projection light beam 4 is defined by an aperture angle θ and an azimuth angle α. FIG. 4 illustrates the position of these two angles: a Cartesian coordinate system of the projection exposure system 1 is shown there, the z axis of which coincides with the optical axis of the projection lens 6. The aperture angle θ is the angle between the light ray 18 and the z axis. The azimuth angle α is the angle between the x axis and the projection of the light ray 18 onto the xy plane.

In the following description, the optical components 9, 10 are oriented so that the (100) crystal direction coincides with the z axis and the projection of the (101) crystal direction onto the xy plane coincides with the x axis.

Figure 5:
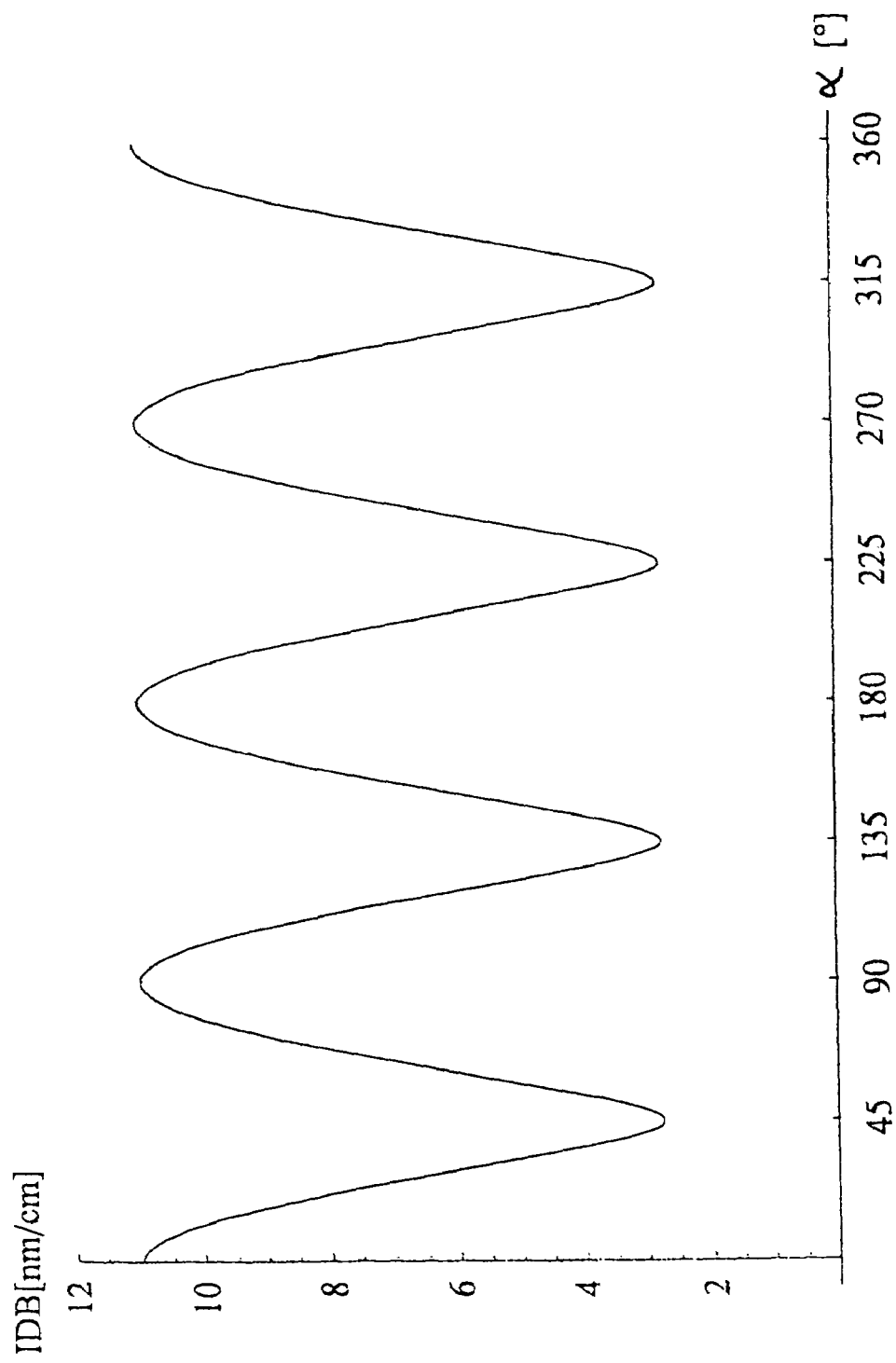
FIG. 5 shows the profile of the intrinsic birefringence of the optical plate in FIG. 3 as a function of the azimuth angle.

FIG. 5 shows the intrinsic birefringence (IDB) of the optical plate 10 as a function of the azimuth angle a for the aperture angle θ=45 degrees. A fourfold symmetry is found, the maxima of the intrinsic birefringence being obtained for light rays whose ray directions coincide with the (101), (110), (10-1) and (1-10) crystal directions (cf. FIG. 3), that is to say for light rays with an aperture angle θ of 45 degrees and an azimuth angle α of 0 degrees, 90 degrees, 180 degrees and 270 degrees. The intrinsic birefringence vanishes (cf. FIG. 3) at an aperture angle of 0 degrees, i.e. a ray direction along the optical axis of the projection lens 6 in the (100) crystal direction.

As the maximum intrinsic birefringence (ray propagation e.g. in the (110) crystal direction, i.e. θ equal to 45 degrees, α equal to 90 degrees), a value of (11.0+/−0.4) nm/cm was measured at a wavelength of 156.1 nm for CaF2.

At the azimuth angles for which intrinsic birefringence occurs (cf. FIG. 5), it decreases continuously with the aperture angle for aperture angles of less than 45 degrees (cf. FIG. 3).

Besides these intrinsic contributions to the birefringence, the lens 9 and the optical plate 10 have additional stress birefringence contributions depending on their installation situation in the projection lens 6, which are added to the intrinsic birefringence. Further birefringence contributions may, for example, be due to crystal defects, in particular the formation of domains. There may even be non-intrinsic birefringence contributions in optical materials which do not have any intrinsic birefringence.

A method for improving the imaging properties of the projection lens 6 is carried out as follows:

First, the optical perturbations of all the optical elements of the projection lens 6 are determined individually. Such measurement methods for determining the aforementioned birefringence contributions as an example of polarisation-dependent perturbations, on the one hand, and polarisation-independent perturbations, on the other hand, are known to the person skilled in the art. To this end, for example, as indicated by the sensor 11 in FIG. 1, a measurement of the overall imaging properties of the projection lens 6 may be carried out in different adjustment states of the projection lens 6.

As an alternative or in addition, the individual optical elements of the projection lens 6 may be analysed independently of one another with the aid of known measurement methods. In this case, care should be taken to simulate the installation situation of the optical elements in the projection lens 6 as precisely as possible during this independent analysis, so as to prevent the installation of the optical elements in the projection exposure system 1 from giving rise to additional perturbation contributions, which impair the optimisation of the imaging properties of the projection lens 6.

The determination of the birefringence contributions may, for example, comprise determination of the position of the crystal axes of the optical elements to be analysed, when crystalline materials are involved.

The measurement results are evaluated by the computer 14. It determines the respective perturbation contributions of the individual optical elements of the projection lens, and assigns these contributions to the individual polarisation-dependent and polarisation-independent perturbations. The computer 14 subsequently calculates and optimises a target function (merit function). This target function takes in the dependencies of the perturbation contributions of all the optical elements on the degrees of freedom in movement of these optical elements (rotation, inclination, centring).

In the exemplary embodiment which is represented, this calculation is carried out for the optical components 9 and 10.

As was mentioned above, the lens 9 is rotatable relative to the optical plate 10 about the optical axis. For the lens 9 and the optical plate 10, their respective contributions to the polarisation-dependent and polarisation-independent perturbations are available after the perturbation contributions have been analysed. Besides the perturbations of the lens 9 and the optical plate 10, the merit function also contains the dependency of the perturbation contributions of the lens 9 on its rotation about the optical axis.

The merit function is subsequently optimised by varying of the degrees of freedom in movement of the mobile parts of the projection lens 6. In the embodiment according to FIG. 1, the merit function is evaluated at each rotation position of the rotatable part 7 of the projection lens 6. The rotation position in which the merit function has the optimum value is subsequently determined.

Finally, the mobile optical elements are brought into the target position which has been determined. In the embodiment according to FIG. 1, the rotatable part 7 with the lens 9 is rotated into the target position which has been determined.

What is claimed is:

1. An optical system, comprising:
   a) at least two optical elements, at least one of which being a movable optical element,
   b) a computer for calculating a target position for the at least one movable optical element such that, in the target position, the total perturbation of the at least two optical elements which is made up of polarization-dependent perturbations and polarization-independent perturbations of the at least two optical elements, is minimized;
   c) an actuator for moving the at least one movable optical element to the target position calculated by the computer.

2. The optical system of claim 1, comprising a sensor for determining for at least one of the at least two optical elements a polarization-dependent perturbation and for determining for at least one of the at least two optical elements a polarization-independent perturbation.

3. The optical system of claim 1, wherein the polarization-dependent perturbation includes stress birefringence.

4. The optical system of claim 2, wherein at least one of the at least two optical elements consists of a crystalline material, and wherein a determination of a polarization-dependent perturbation of the at least one of the at least two optical elements comprises a determination of the position of at least one crystal axis.

5. The optical system of claim 1, in which the at least one movable optical element is configured to be rotated about its axis of symmetry.

6. The optical system of claim 1, in which the at least one movable optical element is configured to be linearly displaced.

7. The optical system of claim 1, in which the at least one movable optical element is configured to be displaced transversely to an optical axis of the optical system.

8. The optical system of claim 1, in which the at least one movable optical element is configured to be tilted relative to an optical axis of the optical system.

9. A photolithographic exposure apparatus comprising the optical system of claim 1.

10. A photolithographic exposure apparatus, comprising at least two optical elements being in a relative position such that the total perturbation of the at least two optical elements which is made up of polarization-dependent perturbations and polarization-independent perturbations is minimized.

* * * * *